United States Patent
Garabandic

(10) Patent No.: US 6,847,196 B2
(45) Date of Patent: Jan. 25, 2005

(54) METHOD AND APPARATUS FOR REDUCING SWITCHING LOSSES IN A SWITCHING CIRCUIT

(75) Inventor: Djordje Garabandic, Burnaby (CA)

(73) Assignee: Xantrex Technology Inc., Burnaby (CA)

( * ) Notice: Subject to any disclaimer, the term of this patent is extended or adjusted under 35 U.S.C. 154(b) by 86 days.

(21) Appl. No.: 10/231,295

(22) Filed: Aug. 28, 2002

(65) Prior Publication Data

US 2004/0041545 A1 Mar. 4, 2004

(51) Int. Cl.$^7$ ............................................... G05F 1/10
(52) U.S. Cl. ...................................................... 323/222
(58) Field of Search ........................ 363/16, 17, 56.01, 363/56.02, 97, 98, 131, 132; 323/220, 222, 223, 232, 233

(56) References Cited

U.S. PATENT DOCUMENTS

| | | | | |
|---|---|---|---|---|
| 6,016,258 A | * | 1/2000 | Jain et al. | 363/17 |
| 6,236,191 B1 | * | 5/2001 | Chaffai | 323/225 |
| 6,525,488 B2 | * | 2/2003 | Nerone et al. | 315/209 R |

OTHER PUBLICATIONS

Nagao, Michihiko and Koosuke Harada; "Effects on Commutation Elements in Inductor Commutation Soft–Switched PWM Inverter and Its Design Equations"; IEEE Transactions on Power Electronics, vol. 16, No. 6, Nov., 2001.

Smith, K. Mark, Jr. and Keyue Ma Smedley; "Lossless Passive Soft–Switching Methods for Inverters and Amplifiers"; IEEE Transactions on Power Electronics, vol. 15, No. 1, Jan., 2000.

Venkataramanan, Giri, Deepakraj M. Divan and Thomas M. Jahns; "Discrete Pulse Modulation Strategies for High–Frequency Inverter Systems"; IEEE Transactions on Power Electronics, vol. 8, No. 3, Jul., 1993.

McMurray, Williams "Efficient Snubbers for Voltage–Source GTO Inverters"; IEEE Transactions on Power Electronics, vol. PE–2, No. 1, Jul., 1987.

Sirisukprasert, Siriroj, Zhenxue Xu, Bin Zhano, Jason Lai and Alex Q. Huang; "A High–Frequency 1.5 MVA H–Bridge Building Block for Cascaded Multilevel Converters using Emitter Turn–Off Thyrister"; IEEE APEC, Feb., 2002.

* cited by examiner

Primary Examiner—Matthew V. Nguyen
(74) Attorney, Agent, or Firm—Christensen O'Connor Johnson Kindness PLLC

(57) ABSTRACT

A method and apparatus for reducing switching losses in a leg of a switching circuit during commutation of current between first and second complementary switching elements thereof is disclosed. The method involves impeding changes in current flow between a load current node and a first supply conductor through a first path comprised of a first saturable inductor and the first switching element, while impeding changes in current flow between the load current node and a second supply conductor through a second path comprised of a second saturable inductor and the second switching element.

17 Claims, 2 Drawing Sheets

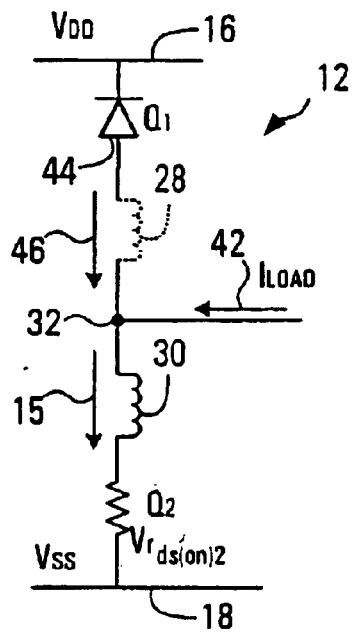
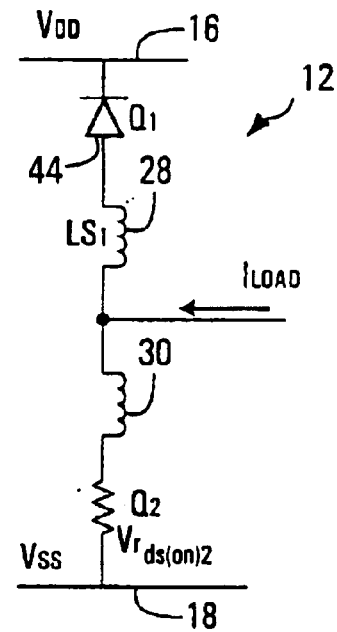
FIG. 4  FIG. 5
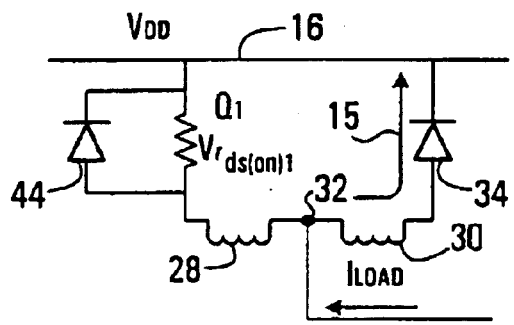
FIG. 6

METHOD AND APPARATUS FOR REDUCING SWITCHING LOSSES IN A SWITCHING CIRCUIT

BACKGROUND OF THE INVENTION

1. Field of Invention

This invention relates to switching circuits involving complementary switching elements and more particularly to methods and apparatus for reducing switching losses in such circuits.

2. Description of Related Art

Switching circuits involving complementary switching elements are commonly found in power inverters, power supplies and Class D amplifiers. In these applications, various types of switching elements may be employed. The usual choices for switching elements include Integrated Gate Bipolar Transistors (IGBTs) and Metallic Oxide Semiconductor Field Effect Transistors (MOSFETs).

MOSFETs have internal body diodes that result from their inherent design. Tradeoffs are made when designing MOSFETs, to optimize and reduce static and dynamic losses, but this often results in the creation of body diodes that have poor inherent reverse recovery characteristics that contribute to losses during reverse recovery of the devices. IGBTs have no internal body diode and typically, external diodes are used with IGBTs to control reverse recovery characteristics in a manner that reduces reverse recovery losses. IGBTs however, exhibit greater static and dynamic losses.

Thus, designers of high frequency switching circuits are faced with selecting between IGBTs and MOSFETS for use as switching elements and must make such selections by making tradeoffs between reverse recovery losses and static and dynamic losses, which can lead to an inefficient design.

SUMMARY OF THE INVENTION

The present invention addresses the above problem by providing a method of reducing switching losses in a leg of a switching circuit during commutation of current between first and second complementary switching elements thereof. The method involves impeding changes in current flow between a load current node and a first supply conductor through a first path comprised of a first saturable inductor and the first switching element, while impeding changes in current flow between the load current node and a second supply conductor through a second path comprised of a second saturable inductor and the second switching element.

The method may involve pre-saturating the first saturable inductor with current in a direction from the load current node to the first supply conductor so that the first saturable inductor is saturated when the first switching element is shut off. Pre-saturating may involve operating the first switching element in an on condition in which sufficient current is flowing therethrough to saturate the first saturable inductor.

Impeding changes in current flow may involve passing current through a series combination of the first saturable inductor and a body diode of the first switching element.

Impeding changes in current flow through the first path may involve operating the first saturable inductor in a saturated mode while operating the second saturable inductor in a linear mode.

Operating the second saturable inductor in a linear mode may involve switching the second switching element on while the second saturable inductor impedes instantaneous current flow therethrough such that at the instant the second switching element is turned on the instantaneous current therethrough is zero.

Operating the first saturable inductor in a saturated mode while operating the second saturable inductor in a linear mode may be followed by operating the first saturable inductor in a linear mode while operating the second saturable inductor in a saturated mode.

The first saturable inductor may impede reverse recovery current flow from the first supply conductor to the load current node thereby limiting a contribution to total current flow in the second path.

The method may involve resetting current flow to zero through the second saturable inductor prior to commutating current from the first switching element to the second switching element. Resetting current flow to zero may involve switching the second switching element off and passing current through the second saturable inductor to a clamping diode connected to the first supply conductor. Resetting may also involve turning the first switching element on while passing current through the clamping diode to rob current from the clamping diode to reduce a voltage drop thereacross to a voltage below a turn on voltage thereof to shut the diode off.

In accordance with another aspect of the invention, there is provided a switching circuit apparatus comprising a load current node operable to receive load current, a first current path comprised of a first saturable inductor connected to the load current node and a first switching element connected to the first saturable inductor and a first supply conductor. The apparatus further includes a second current path comprised of a second saturable inductor connected to the load current node and a second switching element connected to the second saturable inductor and a second supply conductor. The first saturable inductor is operable to impede changes in current flow between the load current node and the first supply conductor while the second saturable inductor is operable to impede changes in current flow between the load current node and the second supply conductor.

The first saturable inductor may be configured to be pre-saturated with current in a direction from the load current node to the first supply conductor so that the first saturable inductor is saturated when the first switching element is shut off.

The apparatus may further include a reset circuit for resetting current flow to zero through the second saturable inductor prior to commutation of current from the first switching element to the second switching element.

The reset circuit may include a diode connected to the second saturable inductor and the first supply conductor.

The first and second saturable inductors may be configured such that the first saturable inductor is operated in a saturated mode while the second saturable inductor is operated in a linear mode at an instant when the second switching element is turned on.

The first and second saturable inductors may be configured such that operating the first saturable inductor in a saturated mode while operating the second saturable inductor in a linear mode is followed by operating the first saturable inductor in a linear mode while operating the second saturable inductor in a saturated mode.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 4 is a schematic representation of an equivalent circuit representing the operation of the first leg immediately after Q2 is turned on wherein a first saturable inductor of the leg is saturated while a second saturable inductor of the leg is in a linear mode;

FIG. 5 is a schematic representation of an equivalent circuit representing the operation of the leg after Q2 is turned on and in a condition where the first saturable inductor is in a linear mode and the second saturable inductor is in a saturated mode; and FIG. 6 is a schematic representation of an equivalent circuit representing a reset operation on the second saturable inductor.

DETAILED DESCRIPTION

Figure 1:
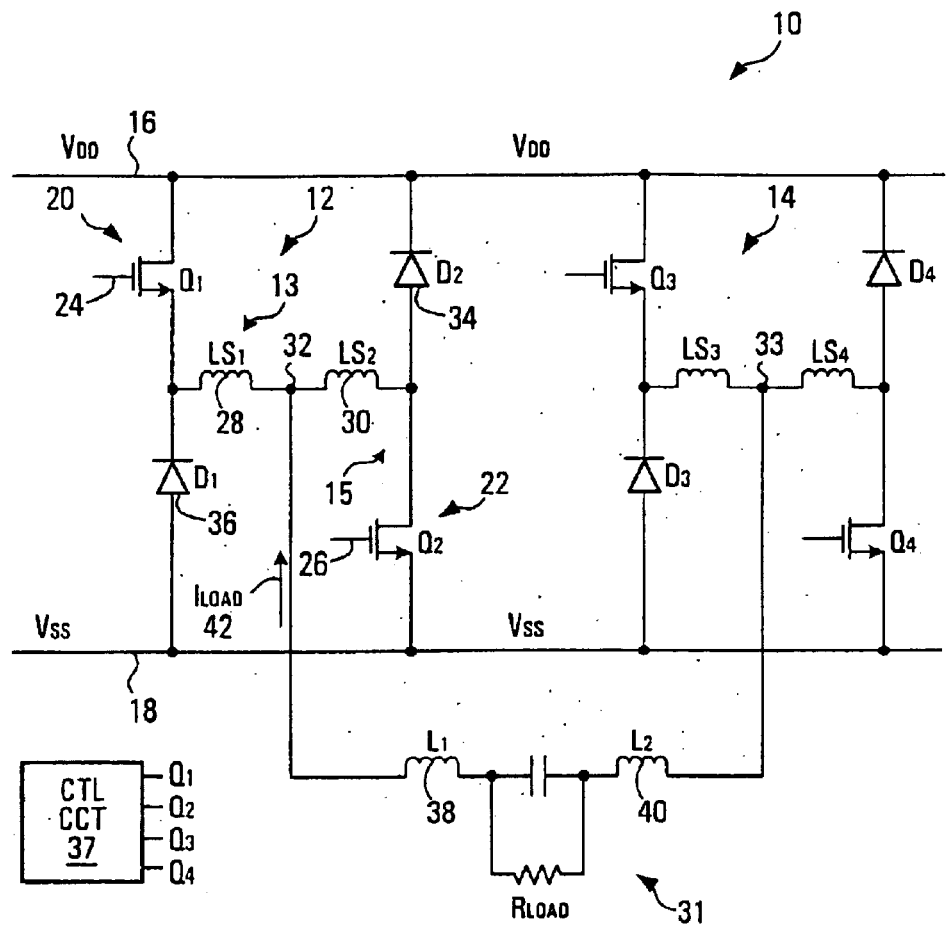
FIG. 1 is a schematic diagram of a switching circuit having first and second legs, according to a first embodiment of the invention.

Referring to FIG. 1 a switching circuit according to a first embodiment of the invention is shown generally at 10. In this embodiment, the switching circuit 10 is a high frequency inverter switching circuit having first and second legs shown generally at 12 and 14, each of which may be considered a separate switching circuit for the purposes of this description.

The first leg 12 has a load current node 32 operable to receive load current from a load inductor 38 in a load circuit 31 that is being supplied with power from the switching circuit 10. The first leg 12 also has a first current path 13 comprised of a first saturable inductor 28 connected to the load current node 32 and a first switching element (Q1) 20 connected to the first saturable inductor 28 and a first supply conductor (Vdd) 16. The first leg 12 also has a second current path 15 comprised of a second saturable inductor 30 connected to the load current node 32 and, in this mode, a second switching element (Q2) 22 connected to the second saturable inductor 30 and a second supply conductor (Vss) 18. The first supply conductor 16 may be at a potential of, say, 250 Vdc relative to the second supply conductor 18, for example.

The first saturable inductor 28 is operable to impede changes in current flow between the load current node 32 and the first supply conductor 16 while the second saturable inductor 30 is operable to impede changes in current flow between the load current node 32 and the second supply conductor 18.

A first clamping diode (D1) 36 is connected between the second supply conductor 18 and a first node connecting together the first switching element Q1 and the first saturable inductor 28 and a second clamping diode (D2) 34 is connected between the first supply conductor 16 and a second node connecting together the second switching element Q2 and the second saturable inductor 30.

The second leg 14 is similar to the first leg 12 and has a second load current node 33, third and fourth switching elements Q3 and Q4 similar to switching elements Q1 and Q2, diodes D3 and D4 similar to diodes D1 and D2 and saturable inductors LS3 and LS4 similar to the first and second saturable inductors LS1 and LS2, all connected in a manner similar to corresponding components of the first leg.

A control circuit 37 is in communication with the switching elements Q1–Q4 and produces switching control signals that control the switching elements to place them in on or off states. The control signals are produced such that Q1 and Q2 are never on at the same time and such that Q3 and Q4 are never on at the same time. More particularly, the control signals are produced such that the switching elements sequence through four states in which the switching elements are on or off. For example, if a 1 is used to represent a switching element being on and a 0 is used to represent a switching element being off, each state may be represented by a binary number, the digits of which represent respective on or off conditions of respective switching elements Q1, Q2, Q3 and Q4. A first state may thus be represented by the number 1010, a second state by the number 0110, a third state by the number 0101 and a fourth state by the number 1001. The two most significant digits of each number represent the states of the first and second switching elements Q1 and Q2 and the two least significant digits represent the states of the third and fourth switching elements Q3 and Q4. The first and third states (1010 and 0101) are generally regarded as passive states and the second and fourth states (0110 and 1001) are regarded as active states.

The switching circuit 10 may be part of a 3 kW power supply, for example, in which case each switching element may effectively receive a switching signal having frequency of 30 kHz, and each switching element may each be a Fairchild Semiconductor FQA55N25 manufactured by Fairchild Semiconductor of California, USA, or similar, for example and the diodes may each be an Advanced Power Technology (APT) APT30D40B, or similar. Each of the first and second saturable inductors 28 and 30 may be comprised of a 0.5 in. by 0.25 in torroidal ferrite core such as Siemens B64290-K004-X830 on which is wound 6 turns of 24 gauge, 7 strand single insulated twisted wire, for example.

Focussing on the first leg 12 of the switching circuit 10, comprising the first and second switching elements Q1 and Q2, the present invention reduces switching losses that can otherwise occur when the switching elements change from a passive state (Q1 and Q3 on; Q2 and Q4 off) to an active state (Q1 and Q4 on; Q2 and Q3 off).

Operation

Each leg 12 and 14 of the switching circuit 10 is identical and therefore only the first leg 12 will be described here. Only the transition from the first passive state (1010) to the first active state (0110) will be described here, in connection with commutation of current from the first switching element Q1 to the second switching element Q2. It will be appreciated that a similar description would apply to the transition between the second passive state and the second active state in respect of commutation from the second switching element Q2 to the first switching element Q1 and that corresponding analogies are applicable to the third and fourth switching elements Q3 and Q4 for corresponding commutations of current in these switching elements.

The commutation of current from the first switching element Q1 to the second switching element Q2 in the first leg 12 may be better understood with reference to FIGS. 2, 3, 4, and 5, which show various equivalent circuits for the first leg 12 at progressive instants in time during commutation.

Q1 On: Steady State

Figure 2:
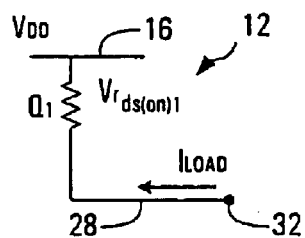
FIG. 2 is a schematic representation of a simplified equivalent circuit for the first leg in a condition where a first switching element Q1 thereof is turned on and is in a steady state, at an instant in time immediately before commutation of current from Q1 to a second switching element Q2.

FIG. 2 depicts a simplified equivalent circuit for the first leg 12 in a condition where Q1 is turned on and is in a steady state, at an instant in time immediately before commutation. Referring back to FIG. 1, during commutation, relatively large load inductors 38 and 40 of the load circuit 35 act as a constant current source such that current flow into and out of the load current node 32 may be regarded as constant. Current flow into the load current node 32 is from the load inductor 38 and current flow out of the load current node is through the first current path 13 comprised of the first saturable inductor 28 and the drain-source resistance $rds_{(on)1}$ of Q1 to the first supply conductor 16. The first saturable inductor 28 is configured to have suitable inductance and core saturation properties to ensure that with sufficient load current flow therethrough it will saturate when the first switching element Q1 is on and current therethrough has reached a steady state.

Referring to FIG. 2, the first saturable inductor 28 is saturated and the current is steady at this instant and thus the first saturable inductor 28 presents virtually no impedance to current flow out of the load current node 32. Virtually all impedance to current flow out of the load current node 32 is provided by $rds_{(on)1}$. Referring back to FIG. 1, the second clamping diode 34 is not turned on, because the voltage thereacross is less than the junction voltage thereof because $rds_{(on)1}$ is so small. While the first saturable inductor 28 is saturated, the control circuit 37 may issue a control signal to shut off the first switching element Q1. The first saturable inductor 28 is thus pre-saturated with current in a direction from the load current node 32 to the first supply conductor 16 at the instant the first switching element Q1 is shut off. At this instant the control circuit 37 maintains the state of a control signal maintaining the second switching element Q2 in an off state for a very short period of time After Q1 is shut off to ensure that both Q1 and Q2 are not on at the same time.

Q1 Off: Onset of Reverse Recovery Immediately After Steady State

Figure 3:
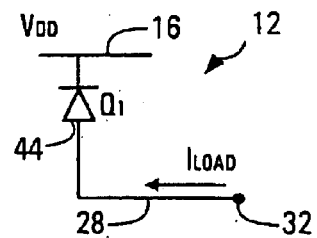
FIG. 3 is a schematic representation of an equivalent circuit representing the operation of the first leg during the onset of reverse recovery in Q1 immediately after Q1 is turned off after being in the steady state condition depicted in FIG. 2.

FIG. 3 depicts an equivalent circuit representing the operation of the first leg 12 during the onset of reverse recovery in Q1 immediately after Q1 is turned off after being in the steady state condition depicted in FIG. 2.

Referring to FIG. 3, at the instant Q1 is turned off, it no longer acts like a resistor (i.e., $rds_{(on)1}$), but rather like a diode due to its inherent body diode 44. Thus, load current continues to flow into the load current node 32 from the load and flows out of the load current node 32 through the series combination of the first saturable inductor 28 and the body diode 44 of Q1 to the first supply conductor 16. Referring to FIG. 1, at this time, the control circuit 37 issues a signal to the second switching element Q2 to cause it to turn on.

Q1 Off, Q2 On: Continuation of Reverse Recovery of Q1, Onset of Current into Q2

Referring to FIG. 4, at the instant Q2 is turned on, it provides a second path for current flow out of the load current node 32. The second saturable inductor 30 impedes changes in current through this second current path 15 and the internal resistance $rds_{(on)2}$ of Q2 provides virtually all of the DC resistance to current flow therethrough.

$rds_{(on)2}$ is typically very low, so a very high current could potentially flow through Q2 were it not for the second saturable inductor 30. This very high current would be supplied by the load inductor 38 and by a reverse current operable to flow in a reverse direction 46 through the body diode 44 of Q1 due to the presence of minority carriers in a junction of the body diode that determine a reverse recovery time thereof. However, the rate of change of current flow through Q2 is limited by the second saturable inductor 30.

In a MOSFET reverse recovery time is dependent upon its reverse breakdown voltage, the potential across the MOSFET and the current flowing through the MOSFET at the time it is switched off. An approximation for reverse recovery time as a function of inductance in a circuit having a MOSFET is provided by authors Ned Mohan, Tore Underland, and William Robbins in a text entitled Power Electronics: Converters Applications and Design published by John Wiley and Sons, New York, N.Y. 1989. This approximation is set forth below:

$$t_{rr} = 2.8 \times 10^{-6} BV_{bd} \sqrt{\frac{Iinv}{V_{dd} - V_{ss}}} Ls \qquad (4)$$

where $t_{rr}$=reverse recovery time
$BV_{bd}$=reverse breakdown voltage of MOSFET
Iinv=Inverter (load) current
$L_s$=inductance of one of $L_{s1}$ and $L_{s2}$ (same)
$V_{dd}$=Positive pole supply voltage
$V_{ss}$=Negative pole supply voltage In addition, the above mentioned text provides an approximation of reverse recovery current as follows:

$$I_{rr} = 2.8 \times 10^{-6} BV_{bd} \sqrt{\frac{Iinv(V_{dd} - V_{ss})}{Ls}} \qquad (5)$$

The undesirable effects of switching losses include increased heat dissipation and electromagnetic noise. Both of these factors are mitigated by reducing the reverse recovery current, however, as can be seen from the above equations, reduction of the reverse recovery current requires a larger inductor to increase the time constant of the circuit to provide more time for the minority carriers in the body diode 44 to recombine. This, however, limits the operable duty cycle of the switching elements and reductions in duty cycle reduce the ability to deliver a significant output voltage. Thus, the selection of the first and second saturable inductors 28 and 30 must be made such that reverse recovery current is minimized, while duty cycle is maximized. Within these limits, suitable properties for the first and second saturable inductors 28 and 30 can be determined as at least a first approximation and then measurements can be taken on a prototype to tune the values of the inductors to values that provide optimum efficiency of the leg.

Still referring to FIG. 4, it will be appreciated that at the instant Q2 is turned on, no current is flowing through $rds_{(on)2}$ since the second saturable inductor 30 is not saturated and effectively blocks instantaneous current flow. Consequently, Q2 experiences a zero current transition when it is turned on.

Since the current supplied by the load inductor (38) is constant, the reverse recovery current that would have been able to flow into the load current node 32 to contribute to the potentially high current through Q2 is limited by the second saturable inductor 30. The second saturable inductor 30 thus reduces reverse recovery current and reduces power losses in the first leg 12.

The current flow through $rds_{(on)2}$ and the second saturable inductor 30 increases at a rate determined by the second saturable inductor while it is in a linear mode or unsaturated mode of operation. Effectively, the impedance to current flow through Q2 changes from infinite to $rds_{(on)2}$ and as this impedance decreases, current flowing from the load current node 32 through the first body diode 44 to the first supply conductor 16 is robbed by current increasingly favoring the second current path 15 through the second saturable inductor 30 and Q2. As the current through the second saturable inductor 30 increases, current flow through the body diode 44 decreases, until the current through the body diode drops to a certain value, at which the first saturable inductor 28 is no longer saturated and enters a linear mode of operation. While the first saturable inductor 28 is in the linear mode it impedes changes in current flow between the load current node 32 and the first supply conductor 16. The first and second saturable inductors 28 and 30 are matched such that by the time the first saturable inductor enters the linear mode of operation, the second saturable inductor is saturated. The equivalent circuit for this condition is shown in FIG. 5.

Referring to FIG. 5, when the second saturable inductor 30 becomes saturated, current can change very quickly in the second path 15 but the first saturable inductor 28 limits the rate of change of current through Q1 and thus takes over in limiting the rate of robbing current from Q1 to Q2 until the body diode 44 of Q1 has recovered and is effectively shut off due to the reverse bias thereon as a result of the potential between the first supply conductor 16 and the second supply conductor 18. Any reverse current that would flow in the reverse direction through the body diode 44 of the first switching element Q1 is impeded by the first saturable inductor 28 which limits the contribution to total current flow in the second current path 15 comprised of the second saturable inductor 30 and the second switching element Q2.

Thus, as shown in FIG. 4, at the instant Q2 is turned on, initially the first saturable inductor 28 is saturated and the second saturable inductor 30 is in a linear mode and thus the first saturable inductor presents little opposition to current flow, while the second saturable inductor primarily limits current flow into Q2 and hence limits reverse current and switching losses in Q1. This also provides for zero current switching of Q2.

As shown in FIG. 5, as current through Q2 increases, the first saturable inductor 28 becomes unsaturated at about the same time the second saturable inductor 30 becomes saturated and, at this time, the first saturable inductor 28 primarily limits reverse current flow in Q1 and hence limits current flow from the first supply conductor (Vdd) into Q2. Thus, operating the first saturable inductor 28 in the saturated mode while operating the second saturable inductor 30 in a linear mode is followed by operating the first saturable inductor 28 in a linear mode while operating the second saturable inductor 30 in a saturated mode. The first saturable inductor 28 impedes current flow between the load current node 32 and the first supply conductor 16 when it is operating in its linear mode and the second saturable inductor 30 impedes current flow between the load current node and the second supply conductor 18 when it is operating in its linear mode.

Referring back to FIG. 1, when current is flowing into the load current node 32 as shown, and current is to be commutated from Q2 to Q1, the control circuit 37 issues a signal to Q2 to shut Q2 off while Q1 is still off, before turning Q1 on again. Thus Q1 and Q2 are both off for a brief period of time before Q1 is turned on again. An equivalent circuit of the leg 12 for the brief instant in time when both Q1 and Q2 are off after Q2 has been on, is shown in FIG. 6.

At the instant Q2 is shut off and before Q1 is switched on, current that was flowing through the second saturable inductor 30 now flows through the second clamping diode 34 and the second saturable inductor remains saturated and presents virtually no impedance to current through the diode. At the same time, current begins to flow from the load current node 32 through the first saturable inductor 28 and through the body diode 44 of the first switching element Q1, but this current flow is impeded by the first saturable inductor 28.

When Q1 is switched on, it presents an alternate path for current from the load current node 32 with an impedance provided by $rds_{(on)1}$ and the first saturable inductor 28. The resistance $rds_{(on)1}$ is considerably less than the on resistance of the second clamping diode 34 and thus, current flow shifts from the second current path 15, now comprised of the second saturable inductor 30 and the second clamping diode 34 to the first current path 13 comprised of the first saturable inductor 28 and Q1. This shift in current flow is initially impeded by the first saturable inductor 28 because the second saturable inductor 30 is still saturated. At about the time the second saturable inductor 30 desaturates and enters its linear mode, the first saturable inductor 28 becomes saturated and thus any further impedance to the shift in current is provided by the second saturable inductor. During this shift in current, since the ultimate voltage drop across $rds_{(on)1}$ will be much less than the forward voltage of the second clamping diode 34, when the voltage drop across the second saturable inductor 30 drops to a certain value, the second clamping diode 34 shuts off and no further current flows through the second current path 15. Thus, current flow through the second saturable inductor 30 is reset to zero by switching the second switching element Q2 off and passing current through the second saturable inductor 30 to the second clamping diode 34 connected to the first supply conductor 16 and then turning on the first switching element Q1 to rob current through the second clamping diode 34 to reduce a voltage drop across the second clamping diode to a voltage below a turn on voltage thereof to shut the diode off. The voltage across the second saturable inductor 30 at the point where the second clamping diode 34 shuts off may be referred to as the reset voltage of the second saturable inductor 30 and may be given by the equation:

$$V_{Reset} = V_D - rds_{(on)1} \cdot I_{LOAD}$$

Where
$V_{Reset}$=the reset voltage for the second saturable inductor
$V_D$=forward voltage of the second clamping diode (34)
$rds_{(on)1}$=on resistance of Q1
$I_{LOAD}$=current through second saturable inductor In effect, the second clamping diode 34 acts as a reset circuit for resetting current flow to zero through the second saturable inductor 30 prior to commutation of current from the first switching element Q1 to the second switching element Q2.

The effect of the switching circuit topology described herein is to limit reverse recovery current in both Q1 and Q2, thereby reducing switching losses while at the same time providing zero current switching for Q1 and Q2. This increases the efficiency of the leg 12 and reduces stresses on Q1 and Q2, thereby extending their lives.

While specific embodiments of the invention have been described and illustrated, such embodiments should be considered illustrative of the invention only and not as limiting the invention as construed in accordance with the accompanying claims.

What is claimed is:
1. A method of reducing switching losses in a leg of a switching circuit during commutation of current between first and second complementary switching elements of the switching circuit, the method comprising:
impeding changes in current flow between a load current node and a first supply conductor through a first path comprised of a first saturable inductor and the first switching element, while impeding changes in current flow between said load current node and a second supply conductor through a second path comprised of a second saturable inductor and the second switching element.

2. The method of claim 1 further comprising pre-saturating said first saturable inductor with current in a direction from said load current node to said first supply conductor so that said first saturable inductor is saturated when the first switching element is shut off.

3. The method of claim 2 wherein pre-saturating comprises operating the first switching element in an on condition in which sufficient current is flowing therethrough to saturate said first saturable inductor.

4. The method of claim 1 further comprising resetting current flow to zero through said second saturable inductor prior to commutating current from the first switching element to the second switching element.

5. The method of claim 4 wherein resetting current flow to zero comprises switching the second switching element off and passing current from said load current node through said second saturable inductor to a clamping diode connected to said first supply conductor.

6. The method of claim 5 wherein resetting comprises turning the first switching element on while passing current through said clamping diode to rob said current through the clamping diode to reduce a voltage drop across the clamping diode to a voltage below a turn on voltage thereof to shut the diode off.

7. The method of claim 1 wherein impeding changes in current flow through the first path comprises operating said first saturable inductor in a saturated mode while operating said second saturable inductor in a linear mode.

8. The method of claim 7 wherein operating said second saturable inductor in a linear mode comprises switching the second switching element on while said second saturable inductor impedes instantaneous current flow therethrough such that at the instant the second switching element is turned on the instantaneous current therethrough is zero.

9. The method of claim 7 wherein operating said first saturable inductor in a saturated mode while operating said second saturable inductor in a linear mode is followed by operating said first saturable inductor in a linear mode while operating said second saturable inductor in a saturated mode.

10. The method of claim 1 wherein impeding changes in current flow comprises passing current through a series combination of said first saturable inductor and a body diode of the first switching element.

11. The method of claim 10 wherein said first saturable inductor impedes reverse recovery current flow through said body diode of the first switching element, from said first supply conductor to said load current node thereby limiting a contribution to total current flow in said second path.

12. A switching circuit apparatus comprising:

a load current node operable to receive load current;

a first current path comprised of a first saturable inductor connected to said load current node and a first switching element connected to said first saturable inductor and a first supply conductor, a second current path comprised of a second saturable inductor connected to said load current node and a second switching element connected to said second saturable inductor and a second supply conductor;

said first saturable inductor being operable to impede changes in current flow between said load current node and said first supply conductor while said second saturable inductor is operable to impede changes in current flow between said load current node and said second supply conductor.

13. The apparatus of claim 12 wherein said first saturable inductor is configured to be pre-saturated with current flowing in a direction from said load current node to said first supply conductor so that said first saturable inductor is saturated when the first switching element is shut off.

14. The apparatus of claim 12 further comprising a reset circuit for resetting current flow to zero through said second saturable inductor prior to commutation of current from the first switching element to the second switching element.

15. The apparatus of claim 14 wherein said reset circuit comprises a diode connected to said second saturable inductor and said first supply conductor.

16. The apparatus of claim 12 wherein said first and second saturable inductors are configured such that said first saturable inductor is operated in a saturated mode while said second saturable inductor is operated in a linear mode at an instant when said second switching element is turned on.

17. The apparatus of claim 16 wherein said first and second saturable inductors are configured such that operating said first saturable inductor in a saturated mode while operating said second saturable inductor in a linear mode is followed by operating said first saturable inductor in a linear mode while operating said second saturable inductor in a saturated mode.

* * * * *